(12) United States Patent
Schuster et al.

(10) Patent No.: US 7,277,231 B2
(45) Date of Patent: Oct. 2, 2007

(54) PROJECTION OBJECTIVE OF A MICROLITHOGRAPHIC EXPOSURE APPARATUS

(75) Inventors: Karl-Heinz Schuster, Koenigsbronn (DE); Hans-Juergen Rostalski, Oberkochen (DE); Aurelian Dodoc, Oberkochen (DE)

(73) Assignee: Carl Zeiss SMT AG (DE)

( * ) Notice: Subject to any disclaimer, the term of this patent is extended or adjusted under 35 U.S.C. 154(b) by 0 days.

(21) Appl. No.: 11/097,398

(22) Filed: Apr. 1, 2005

(65) Prior Publication Data

US 2005/0219707 A1    Oct. 6, 2005

(30) Foreign Application Priority Data

Apr. 2, 2004    (DE)    ............... 10 2004 016 300

(51) Int. Cl.
*G02B 1/06* (2006.01)
(52) U.S. Cl. ........................ 359/665; 359/740
(58) Field of Classification Search ............ 359/665, 359/666, 667, 740
See application file for complete search history.

(56) References Cited

U.S. PATENT DOCUMENTS

| | | | |
|---|---|---|---|
| 5,392,119 A | 2/1995 | McArthur et al. | 356/515 |
| 5,436,766 A * | 7/1995 | Leary | 359/665 |
| 5,446,591 A * | 8/1995 | Medlock | 359/666 |
| 5,459,614 A * | 10/1995 | Leary | 359/665 |
| 5,587,838 A * | 12/1996 | Kasihara | 359/649 |
| 5,682,226 A | 10/1997 | Anzai et al. | 355/53 |
| 5,757,017 A | 5/1998 | Braat | 250/492.2 |
| 6,157,498 A | 12/2000 | Takahashi | 359/728 |
| 6,262,793 B1 | 7/2001 | Sasaya et al. | 355/53 |
| 6,266,389 B1 | 7/2001 | Murayama et al. | 378/34 |
| 6,268,903 B1 | 7/2001 | Chiba et al. | 355/53 |
| 6,333,776 B1 | 12/2001 | Taniguchi | 355/52 |
| 6,522,386 B1 | 2/2003 | Nishi | 355/52 |
| 6,639,651 B2 | 10/2003 | Matsuyama | 355/52 |
| 6,867,923 B2 * | 3/2005 | Singer et al. | 359/667 |
| 2002/0171815 A1 | 11/2002 | Matsuyama et al. | 355/55 |
| 2002/0171922 A1 | 11/2002 | Shiraishi et al. | 359/359 |
| 2003/0063394 A1 | 4/2003 | Suzuki et al. | 359/649 |
| 2003/0081722 A1 | 5/2003 | Kandaka et al. | 378/70 |
| 2003/0123038 A1 | 7/2003 | Kamon | 355/53 |
| 2003/0133087 A1 | 7/2003 | Shima | 355/53 |
| 2003/0184719 A1 | 10/2003 | Shima et al. | 355/52 |
| 2004/0027549 A1 | 2/2004 | Nagayama | 355/55 |
| 2004/0042094 A1 | 3/2004 | Matsuyama | 359/822 |
| 2004/0169836 A1 | 9/2004 | Wegmann | |

FOREIGN PATENT DOCUMENTS

WO    WO 2004/092842 A1    10/2004

\* cited by examiner

*Primary Examiner*—Scott J. Sugarman
*Assistant Examiner*—Darryl J. Collins
(74) *Attorney, Agent, or Firm*—Young Basile

(57) ABSTRACT

A projection objective of a microlithographic projection exposure apparatus has a correction device which can correct photoinduced imaging errors without optical elements having to be removed for this purpose. The correction device includes a first optical element and a second optical element, whose surface facing the first optical element is provided with a local surface deformation for improving the imaging properties of the projection objective. In a wall, which seals an intermediate space formed between the first optical element and the second optical element, an opening is provided through which the intermediate space can be filled with a fluid. By modifying the refractive index of the fluid adjacent to the surface, the effect of the surface deformation can be modified in a straightforward way.

24 Claims, 5 Drawing Sheets

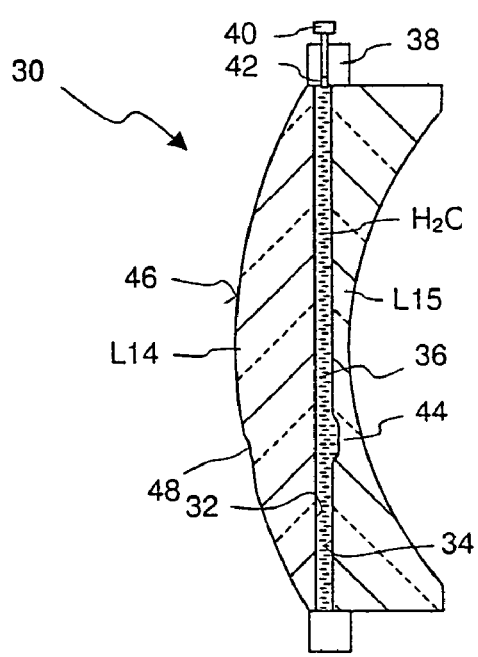
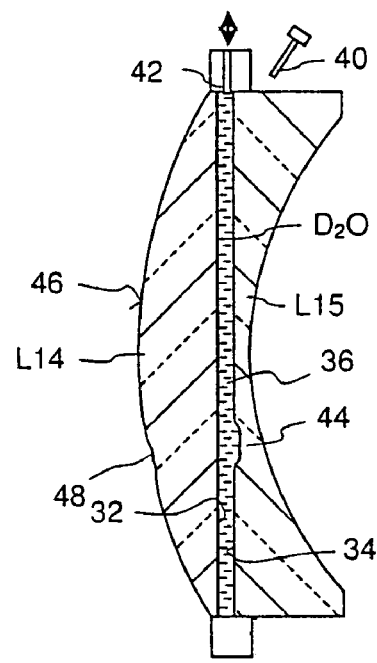
Fig. 2a    Fig. 2b
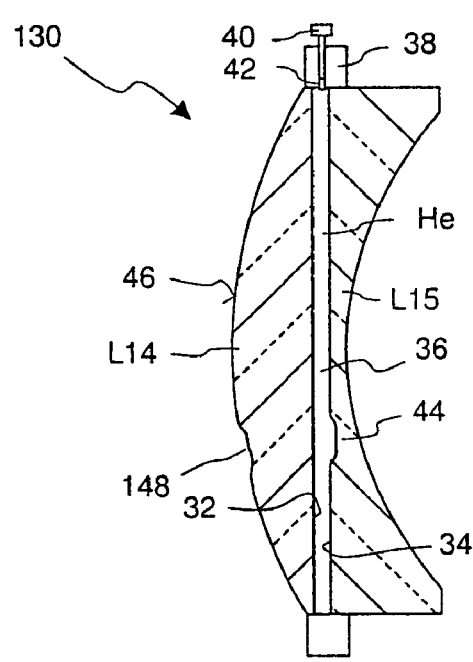
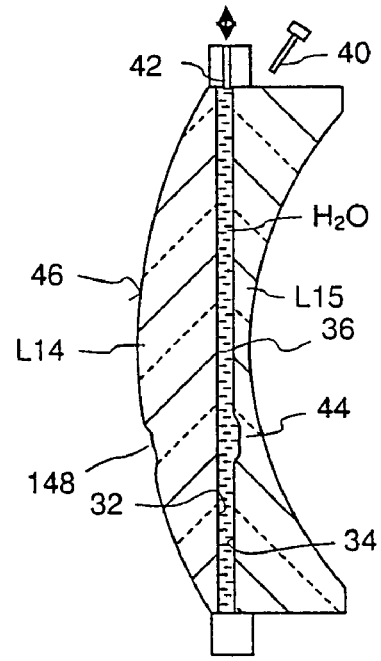
Fig. 3a    Fig. 3b

PROJECTION OBJECTIVE OF A MICROLITHOGRAPHIC EXPOSURE APPARATUS

CROSS-REFERENCE TO RELATED APPLICATIONS

This application claims priority of German patent application 10 2004 016 300.6. The full disclosure of this earlier application is incorporated herein by reference.

BACKGROUND OF THE INVENTION

1. Field of the Invention

The invention relates to a projection objective of a microlithographic projection exposure apparatus. Such apparatuses are used for the production of large-scale integrated electrical circuits and other microstructured components.

2. Description of Related Art

One of the essential aims in the development of projection exposure apparatuses is to be able to lithographically define structures with smaller and smaller dimensions on a photosensitive layer. Small structures lead to high integration densities, and this generally has a favorable effect on the performance of the microstructured components produced with the aid of such systems.

The generation of particularly small structure sizes requires a sufficiently low resolution of the projection objectives. Since the resolution of the projection objectives is proportional to the wavelength of the projection light, successive product generations of such projection exposure apparatuses use projection light with shorter and shorter wavelengths. The shortest wavelengths used at present lie in the ultraviolet spectral range and are usually 193 nm, in a few cases 157 nm.

However, the increasingly short wavelengths and high light powers of the lasers used as projection light sources lead to greater photo-induced ageing phenomena in the optical elements of such projection exposure apparatuses, which degrade the imaging quality. In projection objectives degradations of the imaging quality are tolerable only within extremely narrow limits. The extent to which the ageing progresses also depends on the particular conditions under which the components are produced. Relevant factors include the type of reticle used and the illumination setting selected, i.e. the angular distribution of the projection light illuminating the reticle.

The physical causes for the occurrence of ageing phenomena are manifold and depend primarily on the materials of which the optical elements and/or their coating consist. With high radiation densities, for example, quartz glass commonly used at wavelengths of 193 nm becomes gradually converted—albeit to a small degree—into a crystalline phase which has a higher refractive index than amorphous quartz glass. Extensive transcrystallisation and recrystallisation processes are also observed in the sensitive coatings which are generally applied to refractive optical elements in order to decrease the reflectivity, and to reflective optical elements in order to increase the reflectivity. A common aspect of such material modifications is that they cannot be eliminated per se and therefore cause irreversible damage to the optical elements.

In order to prevent the occurrence of such irreversible damage, it has been proposed to extend the pulse lengths of the lasers used as a light source. This can at least delay those ageing phenomena which are due to nonlinear optical effects, such as may occur at the start and end of each light pulse.

Attempts are also being made to find alternative materials which exhibit less pronounced ageing phenomena at the wavelengths contemplated. Examples of these are calcium fluoride ($CaF_2$), which has the advantage of still being sufficiently transparent not only at a wavelength of 193 nm but also at a wavelength of 157 nm. However, it is difficult to produce this cubic crystalline material with the requisite purity, so that the few available crystals are very expensive. Calcium fluoride furthermore has some unfavorable properties, for example intrinsic birefringence, so that its use as a lens material necessitates special measures which are very elaborate especially at the wavelength of 157 nm.

Once the imaging quality of a projection objective has deteriorated intolerably because of damage attributable to ageing phenomena, it is in principle possible to replace the affected optical elements. However, replacing a plurality of optical elements entails high costs and production delays. At least for cost reasons, therefore, it may be favorable if imaging errors due to ageing phenomena are subsequently corrected by suitable measures. Relevant examples include the realignment of individual optical elements with the aid of manipulators which are known per se. Unfortunately, the category of imaging errors which can be corrected in this way is very limited.

One way to correct small but otherwise almost arbitrary perturbations of the wavefront profile is to apply local surface deformations on selected surfaces of individual optical elements. The surface deformations are designed such that a perturbed wavefront is restored to the intended profile by local phase changes when it passes through the surface deformations.

When worn-out optical elements are replaced or reprocessed it is necessary to take the projection exposure apparatus out of operation for some time. The projection exposure apparatus cannot be used for the production of microstructured components during a period which may last days or even weeks owing to the complexity of the projection objectives. This leads to great financial losses.

SUMMARY OF THE INVENTION

It is an object of the invention to provide a projection objective of a microlithographic projection exposure in which the imaging quality can be maintained over long operating times, without leading to prolonged stoppages of the projection exposure apparatus because of removal and installation work.

This object is achieved by a projection objective comprising:

a) a first optical element,
b) a second optical element having a surface facing the first optical element, wherein said surface has a local surface deformation for improving at least one imaging property of the projection objective,
c) a wall which seals an intermediate space formed between the first optical element and the second optical element, and
d) an opening in the intermediate space for filling the intermediate space with a fluid.

The fact that the intermediate space between the two optical elements can be filled with a fluid having different properties, or that the properties of a fluid with which it is filled can be modified, makes it possible to influence the effect of the local surface deformation via the choice of the fluid adjacent to it. For example, if the fluid has a refractive index which corresponds at least approximately to the value of the refractive index of the second optical element, then the surface deformations exert virtually no effect because of the vanishingly small refractive index difference at the interface between the surface and the fluid. If the surface deformations are intended to exert a significant effect, for instance in order to correct ageing-induced imaging errors, then the intermediate space may be filled with a fluid such that the refractive index ratio at the interface differs significantly from 1. The greater the refractive index ratio is between the fluid, on the one hand, and the second optical element or a coating applied on it, on the other hand, the greater the effect of the local surface deformation will be.

The invention therefore makes it possible for correcting effects generated by surface deformations to be varied within wide limits, or even completely "switched on" or "switched off", without optical elements having to be removed from the projection objective for this purpose. The invention furthermore makes it possible to anticipate ageing-induced imaging errors during the production of the projection objective, and to prepare suitable correction measures which will not be activated until a freely selectable time during the course of operation by simple modification of the refractive index of the fluid.

The refractive index may, for example, be modified after a predetermined period of time following first use of the projection objective or after a predetermined number of projection operations have been carried out. The modification may furthermore be carried out when measurements on the projection objective have shown that at least one predetermined imaging property of the projection objective has deteriorated by more than a predetermined amount. The latter variant is preferred in so far as when the projection objective is being designed, the way in which the projection exposure apparatus will be used for the production of microstructured components is generally not known. As already explained in the introduction, the occurrence of ageing phenomena also depends on conditions which are not known during production, for example the illumination setting to be selected.

The fact that the effect of the local surface deformation can be modified via the refractive index of the adjacent fluid, moreover, is not only advantageous with a view to the correction of ageing-induced imaging errors. For example, it also makes it possible for the projection objective to be adapted to different illumination settings, which are provided by an illumination system of the projection exposure apparatus. For example, the surface deformation may then be designed so that it only corrects imaging errors which occur in a particular illumination setting but which do not occur, or occur only to a lesser extent, in another illumination setting. Each time a change is made between such illumination settings, the refractive index of the introduced fluid is then modified, for example by replacing it with another fluid or by changing the mixing ratios between two fluids, the pressure and/or the temperature.

In relation to the correction of imaging errors which are caused by ageing phenomena, it is of course particularly preferable for the local surface deformation to be designed so that it is thereby possible for at least one imaging error, which does not occur owing to ageing phenomena until after a plurality of projection cycles have been carried out, to be corrected at least partially.

It is nevertheless feasible to apply a surface deformation on one of the other optical elements of the projection objective, and to design the surface deformation on the second optical element, such that it compensates almost completely for the effect of the surface deformation on the other optical element when a particular fluid is selected. In this configuration of the invention, the imaging errors are corrected not when the surface deformation on the second optical element exerts its effect, but when it loses its effect, since it is then that it no longer compensates for the effect of the surface correction on the other optical element.

The fluids with which the intermediate space is filled may be gases or liquids. In order for the surface deformation on the second optical element to lose its effect completely, the refractive index of the introduced fluid must be exactly the same as the refractive index of the material in which the surface deformation is formed. For the conventionally used lens materials such as quartz glass, however, the refractive index is so high that there are no available fluids which have an equally high refractive index. In these cases, even if the intermediate space is filled with the fluid which has the highest available refractive index, there will be a refractive index difference at the interface between the fluid and the second optical element. The deformation on its surface is therefore optically active at least to a minor extent.

In order to make it possible to eliminate the effect of this surface deformation completely, as may for example be desirable in a delivery state of the projection objective, two variants are proposed.

In a first variant, one of the optical elements contained in the projection objective has a local compensating surface deformation which is designed so that its effect compensates as fully as possible for the effect due to the surface deformation on the second optical element, when a suitable fluid is selected. The purpose of the compensating surface deformation is merely to compensate for an inevitable residual effect of the surface deformation on the second optical element. If the intermediate space is subsequently filled with a fluid having a different (generally lower) refractive index, then the effect of the surface deformation on the second optical element becomes pronounced.

The local compensating surface deformation may in this case be arranged on a surface, not adjacent to the intermediate space, of one of the two optical elements. This is expedient particularly when there are only a few suitable places in the projection objective where surface deformations can exert the intended effect.

In the second variant for completely eliminating the effect of the local surface deformation on the second optical element, the surface deformation is not formed directly on the second optical element. Instead, the second optical element has a coating, the refractive index of which is at least substantially identical to the refractive index of a fluid with which the intermediate space can be filled, on its surface facing the first optical element. The local surface deformation for improving the at least one imaging property is produced directly in the coating. This variant is based on the discovery that there are coatings whose refractive index is lower than those of conventional lens materials such as quartz glass. It is then possible to find combinations of fluids and coatings, or mixed coatings, whose refractive indices are exactly equal.

The projection objective may have a manipulator system for controlled modification of the refractive index of the fluid contained in the intermediate space. Then, for example, the refractive index may be modified by effects of a thermal, electrical or mechanical nature. In the case of gases, for example, it is possible to increase the pressure in the intermediate space by supplying heat or delivering additional gases, which is generally associated with a modification of the refractive index.

In general, however, it is simplest to modify the refractive index by replacing an introduced fluid with a fluid having a different refractive index.

It is particularly preferable to use a liquid as the fluid, since liquids generally have a higher refractive index than gases. Replacement of fluids is facilitated when the manipulator system has a feed device for delivering fluids with different refractive indices. The manipulator system may then have two containers for storing the fluids, as well as a pump which can move the fluids between the intermediate space and the containers.

The manipulator system may comprise a mixing device for mixing fluids with different refractive indices in a predetermined able mixing ratio, which is preferably between 0:1 and 1:0. This makes it possible for the refractive index of the liquid with which the intermediate space is filled to be established continuously at an extremely high accuracy with the aid of the mixing ratio. The fluids may, for example, be liquid $H_2O$ and liquid $D_2O$, whose refractive indices are quite similar, so that the refractive index can be set very accurately by modifying the mixing ratio. In fact, relatively slight refractive index modifications are generally sufficient to modify the effect of the surface deformation perceptibly.

The manipulator system may have a closed circuit in which the fluid can be circulated. This ensures that the fluid cannot come in contact with a surrounding atmosphere, and thereby become contaminated. A filter for purifying the circulated fluid may furthermore be integrated in the manipulator system, so that constant physical conditions can be achieved in the intermediate space even over a prolonged time.

The manipulator system preferably may have a first measuring device, which measures the refractive index of the fluid flowing into the intermediate space, and a second measuring device which measures the refractive index of the fluid flowing out of the intermediate space. By comparing the measured refractive indices, it is possible to ensure that the fluid contained in the intermediate space has a homogeneous refractive index. The measuring devices may, for example, be refractometers, which can carry out the measurements continuously and automatically.

In another configuration of the invention, the mutually opposing faces of the first optical element and the second optical element are substantially flat and extend parallel to each other. The fluid-filled intermediate space then merely has the effect of a plane-parallel plate so that it is possible to reduce particular image errors due to misalignments.

In particular, a pupil plane or the vicinity of a pupil plane of the projection objective is suitable as a place for the second optical element with the surface deformation applied on it. This is due to the fact that ageing-induced imaging errors can often be corrected most favorably with the aid of surface deformations positioned in or in close proximity to a pupil plane. An optical surface is considered to be positioned in the vicinity of a pupil plane if its vertex is positioned at a distance from the pupil plane such that the ratio between the height of a chief ray traversing the field plane at maximum distance from the optical axis to the height of a marginal ray traversing the field plane on the optical axis is less than 0.3.

The invention may moreover be employed advantageously not only for refractive optical elements but also for mirrors, since imaging errors can also be corrected there by surface deformations. It should furthermore be noted that the wall may also be part of the first or second optical element.

According to a second aspect, the aforementioned object is achieved by a projection objective comprising:
a) a first optical element having a surface with a first local surface deformation for improving at least one imaging property of the projection objective,
b) a second optical element having a surface with a second local surface deformation that is configured such so it compensates at least substantially for effects of the first local surface deformation when the second optical element is in a predetermined spatial relation to the first optical element, and
c) a manipulator for modifying the spatial relation between the first optical element and the second optical element.

A projection objective configured in this way also uses the opportunity to anticipate ageing-induced imaging errors, and implement suitable correction measures which will not be activated until during the course of operation. Modification of the spatial relation between the two optical elements during the course of operation negates the mutual compensation of the effects produced by the surface deformations, as it was originally set up; the overall effect achieved is preferably designed so that it is thereby possible to correct the imaging errors at least partially.

The adjusting device may rotate the first optical element relative to the second optical element through an azimuthal angle. Such a rotation does not affect the other properties of the usually axisymmetric optical elements, but merely modifies the spatial relation of the generally non-axisymmetric surface deformations.

The spatially displaceable optical element or elements may be plane-parallel plates. Such an arrangement has a smaller effect on the overall imaging than an optical element with refracting power, and there are therefore less stringent requirements for exact positioning.

BRIEF DESCRIPTION OF THE DRAWINGS

Various features and advantages of the present invention may be more readily understood with reference to the following detailed description taken in conjunction with the accompanying drawing in which:

FIG. 2a shows a first exemplary embodiment of a correction device according to the invention in a first correction state;

FIG. 2b shows the correction device as shown in FIG. 2a in a second correction state;

FIG. 3a shows another exemplary embodiment of a correction device according to the invention in a first correction state;

FIG. 3b shows the correction device as shown in FIG. 3a in a second correction state;

DESCRIPTION OF PREFERRED EMBODIMENTS

Figure 1:
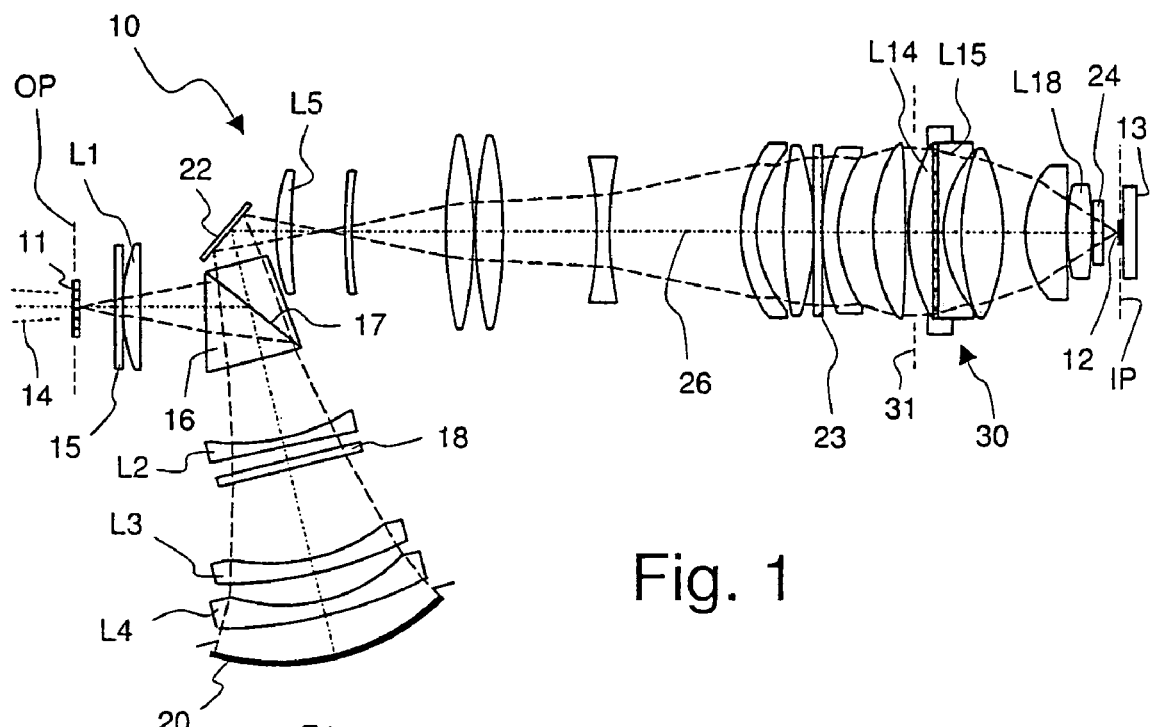
FIG. 1 shows a projection objective of a microlithographic projection exposure apparatus in a simplified meridian section which is not true to scale.

FIG. 1 represents a projection objective of a microlithographic projection exposure apparatus, denoted in its entirety by 10, in a simplified meridian section. The projection objective, which is also described in international patent application PCT/EP03/04015 assigned to the applicant, is used to project a reduced image of structures contained in a reticle 11 onto a photosensitive layer 12, which is applied to a substrate 13. The reticle 11 is arranged in an object plane OP and the photosensitive layer is arranged in an image plane IP of the projection objective 10.

After passing through the reticle 11, a projection light beam 14 indicated by dashes in FIG. 1, which is generated by an illumination system of the projection exposure apparatus and has a wavelength $\lambda=193$ nm in this exemplary embodiment, travels through a plane-parallel plate 15 and a lens L1 into a beam splitter cube 16. There, the projection light beam is reflected at a polarization-selective beam splitter layer 17 contained in the cube 16, and propagates through a lens L2, a quarter-wave plate 18 and two further lenses L3 and L4 onto a spherical mirror 20.

After reflection at the spherical mirror 20, the projection light beam 14 travels back through the lenses L4 and L3, the quarter-wave plate 18 and the lens L2, and strikes again the polarization-selective beam splitter layer 17. There, however, the projection light beam is not reflected but transmitted since the polarization of the projection light beam 14 has been rotated through 90° owing to the double transit through the quarter-wave plate 18. From the beam splitter cube 16, the projection light beam 14 travels via a plane mirror 22 into a purely dioptric part of the projection objective 10. In this dioptric part, lenses L5 to L18 (not dealt with in detail), a further plane-parallel plate 23 and a plane-parallel terminating plate 24 are arranged along an optical axis indicated by 26. The two lenses L14 and L15 arranged in the vicinity of a pupil plane 31 are in this case part of a correction device 30 whose structure will be explained in more detail below with reference to FIGS. 2a and 2b.

The lenses L1 to L18, the plane-parallel plates 15 and 23, the terminating plate 24 and the beam splitter cube 16 will be referred to below as the optical elements of the projection objective 10. The optical elements L1 to L18, 15, 16, 23, 24 are made of quartz glass and each have anti-reflective coatings, as are known per se in the prior art, on the surfaces exposed to projection light. The coatings may, for example, consist of layered structures which are produced by alternate vapor deposition of $MgF$ and $Al_2O_3$.

The projection objective is configured and aligned so that, before the first use of the projection exposure apparatus, it has imaging errors so small that the dimensional compliance of the microstructured components fabricated with the aid of the projection exposure apparatus is not impaired.

The projection light beam 14, however, is so intense that, after some time, photo-induced material modifications occur in the optical elements L1 to L18, 15, 16, 23, 24 through which the projection light beam 14 passes. The coatings applied on these optical elements may also been modified by transcrystallisation and recrystallisation because of the energetic projection light. Owing to these ageing phenomena, the refractive indices of the materials generally changes locally which modifies the optical properties of the affected optical elements. Within certain limits, such modifications are tolerable during the course of the operation of the projection exposure apparatus. If the photo-induced perturbations exceed a particular amount, however, correction measures are necessary in order to restore the imaging quality originally provided.

The correction device 30, which is represented by FIGS. 2a and 2b in two different correction states on an enlarged scale in a meridian section, is provided in order to correct such ageing-induced imaging errors.

As mentioned above, the correction device 30 includes the two lenses L14 and L15 whose mutually opposing flat surfaces 32 and 34 define between them an elongate intermediate space 36 which, in the represented exemplary embodiment, has the shape of a thin disc of constant thickness. The two lenses L14 and L 15 may, for example, be created by cleaving a single lens originally provided.

The correction device 30 furthermore includes an annular wall 38 which seals the intermediate space 36 in the radial direction, i.e. perpendicularly to the optical axis 26. The purpose of the wall 38 is merely to prevent any leakage of a liquid with which the intermediate space 36 is filled. To this end, for example, the wall 38 may be integrated in one of the frames (not shown) of the lenses L14 or L15, or it may be designed as an elastic sealing ring which is clamped between the frames of the lenses L14 and L15.

In order to be able to fill the intermediate space 36 with a liquid, the wall 38 has an opening 42 which can be sealed by a plug 40.

FIG. 2a shows the correction device 30 in a first correction state, in which the liquid with which the intermediate space 36 is filled is highly pure water $H_2O$. The refractive index of light water is somewhat less than the refractive index of the lenses L14 or L15 made of quartz glass, so that the water-filled intermediate space 36 acts optically as a thin plane-parallel plate. In order for the water to have a constant refractive index over the entire area of the intermediate space 36, it has to be ensured that the water contains no impurities or gas bubbles.

On the surface 34 of the lens L15 which faces the lens L14, a rotationally asymmetric surface deformation 44 produced by slight material erosion of the otherwise flat surface 34 is formed. This slight material erosion which, for example, may have an order of magnitude of between a few angstroms and a few nanometres, has been carried out so that the rotationally asymmetric surface deformation 44 corrects one or more ageing-induced imaging errors at least partially when the intermediate space 36 contains highly pure heavy water $D_2O$ instead of light water $H_2O$, as represented in FIG. 2b. Heavy water $D_2O$ has a somewhat lower refractive index than light water $H_2O$, which leads to a greater refractive index difference at the surface 34 of the lens L15.

Since the light water with which the intermediate space 36 was originally filled has a lower refractive index than the lens L15 consisting of quartz glass, a refractive index ratio not equal to 1 is created at the interface between the lens L15 and the light water $H_2O$, and therefore in the region of the rotationally asymmetric surface deformation 44. The rotationally asymmetric surface deformation 44 would thus still exert a residual optical effect when the intermediate space 36 contains light water, as represented in FIG. 2a.

In order to compensate for this residual effect, a local compensating surface deformation 48 is produced on the surface 46 of the lens L15 on the other side from the lens L14 in the exemplary embodiment represented in FIG. 2a, and it is configured so that the effects of the two surface deformations 44 and 48 substantially cancel each other out when the intermediate space 36 is filled with light water $H_2O$. When changing from light to heavy water as represented in FIGS. 2a and 2b, however, this compensation effect is partially lost owing to the greater refractive difference at the surface deformation 44, so that the correction device 30 as a whole starts to exert its correction effect. With a lower refractive index of the liquid with which the intermediate space 36 is filled, the correction effect due to the rotationally asymmetric surface deformation 44 will then be commensurately greater.

If, during the course of the operation of the projection exposure apparatus, ageing-induced damage occurs and it thus becomes necessary to correct imaging errors resulting therefrom, then the light water $H_2O$ with which the intermediate space 36 is filled will be replaced by heavy water $D_2O$ during a comparatively short projection pause. To this end, it is merely necessary to remove the plug 40 and pump the light water $H_2O$ out of the intermediate space 36 via the opening 42. The intermediate space 36 is subsequently filled with the heavy water $D_2O$ via the opening 42, which is finally resealed with the plug 40.

It is clear that the local surface deformation 44 indicated in FIGS. 2a and 2b has been greatly exaggerated for the sake of illustration and clarity. The rotationally asymmetric surface deformation 44 need not even be restricted to a single fairly small place on the surface 34, but may be distributed over the entire area 34. The rotationally asymmetric surface deformation 44 may also comprise a plurality of mutually separated regions, in which the surface 34 of the lens L15 is not exactly flat.

In order to determine the shape of the rotationally asymmetric surface deformation 44, the imaging errors which will occur later due to ageing phenomena and the rotationally asymmetric surface deformation 44 necessary for their correction are already pre-calculated during the production of the projection objective 10. To this end, the way in which the radiation exposure is spatially distributed over the volume of the individual optical elements is calculated for each optical element L1 to L18, 15, 16, 23, 24. From this distribution, a predicted refractive index modification is calculated for each individual optical element.

Since such simulations can only be carried out with a limited accuracy, it is also feasible to include relevant empirical values which may be derived from measurements on projection objectives already being used. If, for example, the profile of the wavefront arriving at the image plane is periodically determined on projection objectives of the same design with the aid of known measuring devices, then conclusions can be drawn therefrom as to the way in which ageing-induced modifications typically occur under particular operating conditions.

Instead of light and heavy water, other liquids whose refractive indices differ from each other may also be used in the correction devices 30 shown in FIGS. 2a and 2b. Furthermore, gases may also be envisaged as fluids with which the intermediate space 36 can be filled. With a mixture of molecular nitrogen and molecular hydrogen, for example, if the mixing ratio is modified in favor of hydrogen then the refractive index difference at the surface 34 becomes greater so that the rotationally asymmetric surface deformation 44 can be "switched on".

FIGS. 3a and 3b show another exemplary embodiment of a correction device, which is denoted in its entirety by 130. The correction device 130 differs from the correction device 30 shown in FIGS. 2a and 2b merely in that a different local compensating surface deformation 148 is provided on the surface 46 of the lens L14. This compensating surface deformation 148 is designed so that it substantially compensates for the effect of the rotationally asymmetric surface deformation 44 on the surface 34 of the lens L15 when the intermediate space 36 between the two lenses L14 and L15 is filled with helium gas, as shown in FIG. 3a.

If ageing-induced imaging errors which need to be corrected by the correction device 130 occur in the course of the operation of the projection exposure apparatus, then the intermediate space 36 will be filled with a liquid, for example light water. The refractive index difference at the surface 34 of the lens L15 is thereby reduced, so that the rotationally asymmetric surface deformation 44 on the surface 34 loses some of its effect. In this exemplary embodiment, therefore, the correction effect is provided not by the rotationally asymmetric surface deformation 44 on the lens L2 but, so to speak, by the "uncompensated" part of the surface deformation 148 on the outside of the lens L14.

Figure 4:
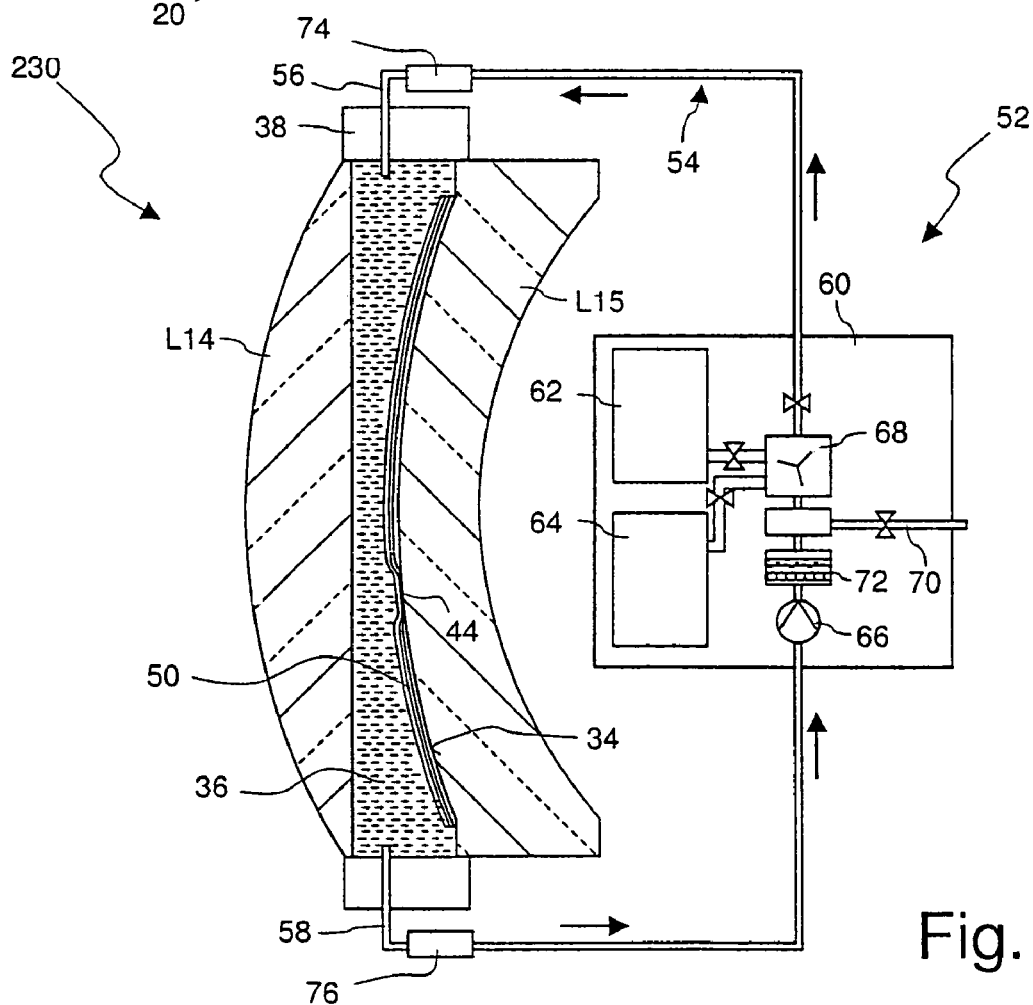
FIG. 4 shows an exemplary embodiment of a correction device according to the invention, which has a circuit for circulating a liquid mixture.

FIG. 4 shows another exemplary embodiment of the correction device, which is denoted overall by 230. In contrast to the correction devices 30 and 130 described above, the rotationally asymmetric surface deformation 44 in the correction device 230 is not produced directly on the surface 34 of the lens L15 but in an anti-reflective coating 50 applied thereon. This coating 50 is designed so that its refractive index corresponds to that of a mixture of light water and heavy water in equal parts. Such a coating may, for example, be produced by alternate vapor deposition of magnesium chloride and lanthanum fluoride, or as a mixed coating in which the two coating components are applied simultaneously.

After the vapor deposition on the surface 34 of the lens L15, the coating 50 is processed further by methods known as such, for example ion beam etching. In this case, the shape of the surface deformation 44 is determined such that ageing-induced imaging errors occurring at a later time are compensated for at least partially when the liquid mixture in the intermediate space 36 has a particular refractive index, which differs from the refractive index originally selected.

Since the refractive index of the mixture of light and heavy water is the same as the refractive index of the coating 50, the surface deformation 44 exerts no effect with the predetermined mixing ratio between light and heavy water. If the coating 50 does not have exactly the intended refractive index, then it is always possible to achieve a state in which the rotationally asymmetric surface deformation 44 remains entirely ineffective by slightly modifying the initially predetermined mixing ratio between the two liquid components.

If photo-induced imaging errors which need to be corrected by the correction device 230 occur subsequently, then the mixing ratio of light and heavy water will be modified so that the mixture has the refractive index which was assumed when calculating the rotationally asymmetric surface deformation 44. This principle may of course also be applied to gases, and it is not restricted to the case shown in FIG. 4 where the rotationally asymmetric surface deformation 44 is not produced directly on the surface 34 of the lens L15 but in a coating 50 applied thereon.

In order to modify the mixing ratio between the two liquid components, the correction device 230 has a manipulator system 52 which comprises a liquid circuit 54 with a feed 56 and a discharge 58. Containers 62, 64, in which light water H₂O and heavy water D₂O are respectively stored, are arranged in a storage unit 60. The storage unit 60 furthermore comprises a pump 66 which circulates the liquid mixture in the liquid circuit 54. Liquid from one of the two containers 62 or 64 can be added via the mixer 68 under the control of valves, in order to modify the mixing ratio. Excess liquid can be removed from the liquid circuit 54 via an outlet 70. The storage unit 60 furthermore comprises a filter system 72 for progressively purifying the liquid being circulated in the liquid circuit 54.

A first refractometer 74 and a second refractometer 76 are provided in the vicinity of the openings of the feed 56 and the discharge 58 into the intermediate space 36. The refractometers 74, 76 measure—preferably continuously—the refractive index of the liquid mixture flowing into the intermediate space 36 and out of it, respectively. If the refractive indices are equal to within predetermined tolerances, then it may be assumed that the liquid mixture in the intermediate space 36 has the intended homogeneous refractive index. Otherwise better mixing and temperature homogenization may be induced, for example, by stronger circulation of the liquid mixture.

Nevertheless, it is not always necessary that the correction device 30 can be brought into a state in which it does not exert any corrective effect owing to local surface deformations. For example, if imaging errors existing a priori are merely amplified owing to the photo-induced ageing of the projection objective, then the correction device 30 may be designed so that these original imaging errors are corrected. If the refractive index difference at the deformed surface 44 is then increased, then the correction effect originally provided may subsequently be further enhanced.

Figure 5:
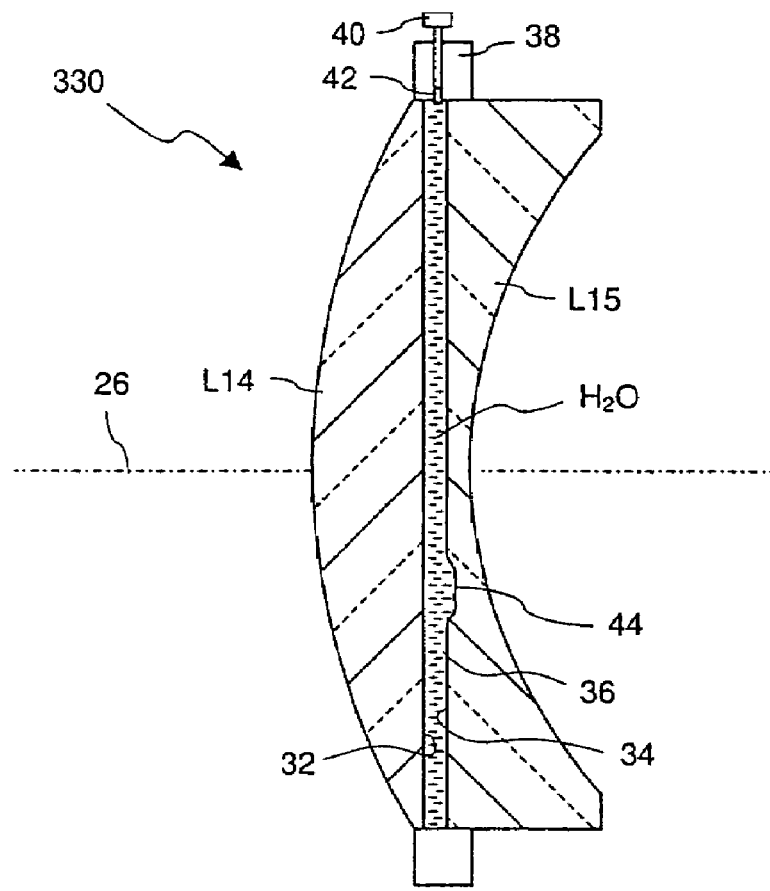
FIG. 5 shows another exemplary embodiment of a correction device according to the invention, which is intended to correct imaging errors that occur with different illumination settings.

According to another exemplary embodiment, FIG. 5 shows a correction device denoted by 330 in which there is a rotationally asymmetric surface deformation 44 merely at the surface 34 of the lens L15. Since the water in the intermediate space 36 has a different refractive index than the lens L15, but on the other hand there are no compensating surface deformations for equalization, then the rotationally asymmetric surface deformation 44 always provides a correction effect. The extent of this effect may then be influenced by the refractive index of the fluid in the intermediate space 36. By adding heavy water, for example, it is possible to reduce the refractive index so that the correction effect is increased.

Figure 6:
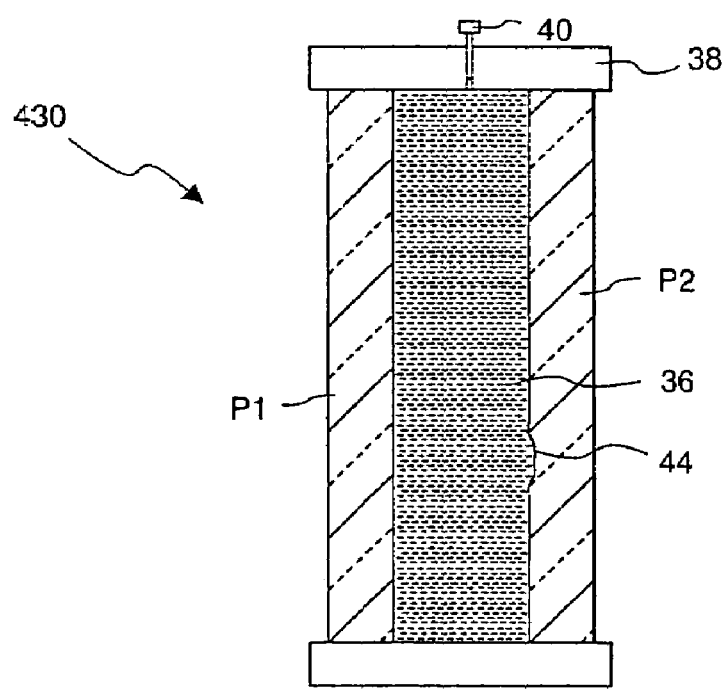
FIG. 6 shows a correction device similar to the correction device represented in FIG. 5, but with optical elements having planar parallel surfaces.

FIG. 6 shows a similar correction device, denoted by 430, in which the intermediate space 36 is bounded not by two imaging lenses but by two plane-parallel plates P1 and P2. The correction device 430 has the advantage that it can also be integrated retrospectively into existing objective designs, since the correction device 430 has, apart from the rotationally asymmetric surface deformation 44, no substantial effect on the image formation. By adding heavy water, for example, it is possible to reduce the refractive index so that the correction effect is increased.

Figure 7:
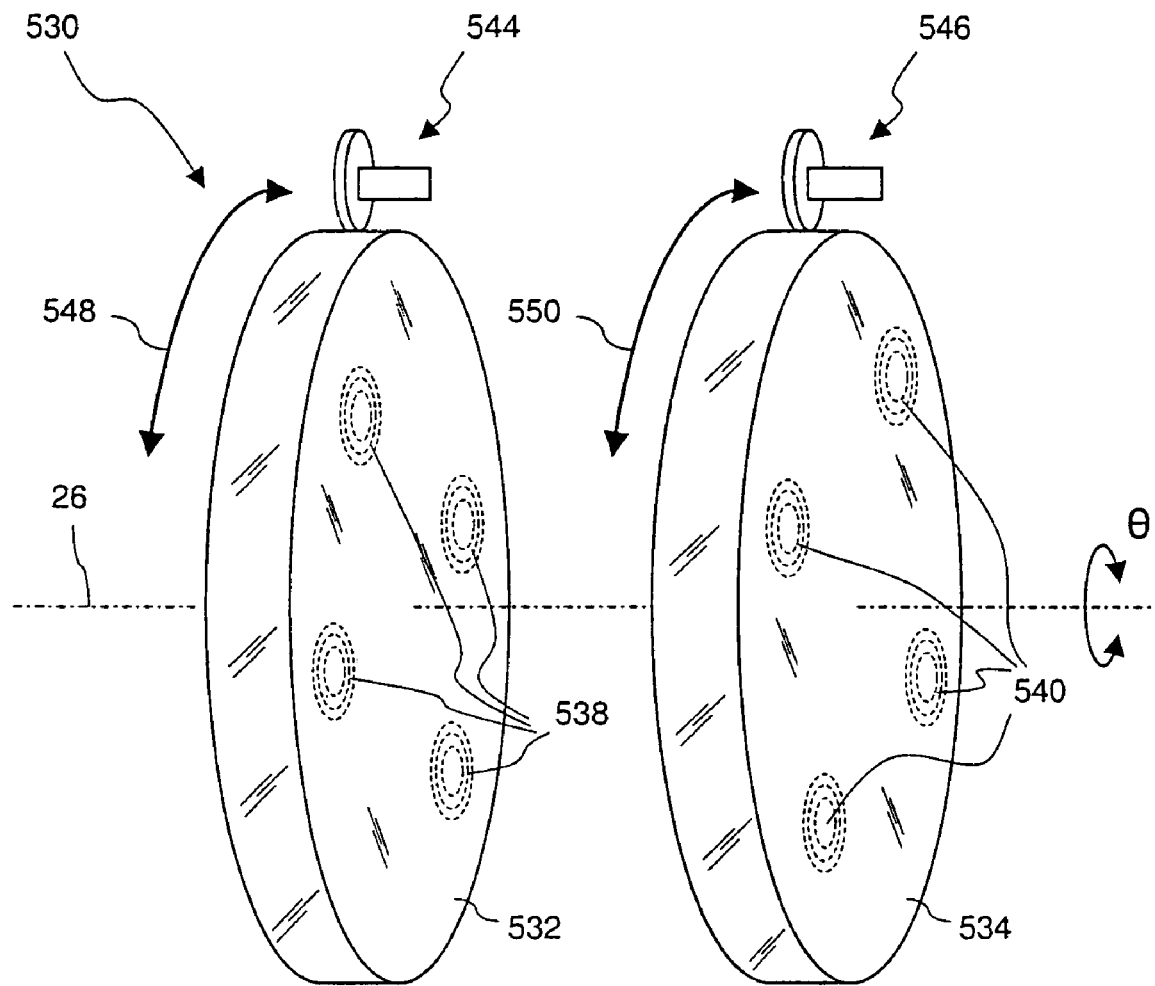
FIG. 7 shows a perspective representation of a correction device according to another aspect of the invention.

FIG. 7 shows a correction device 530 according to another aspect of the invention. In the correction device 530, the ability to modify, and in particular to switch on and off, a correction effect caused by a local surface deformation is achieved not by modifying a refractive index difference but by modifying the relative position of two correction elements.

To this end, the correction device 530 has two plane-parallel plates 532 and 534, which are arranged successively along an optical axis 26. Respective surfaces of the plane-parallel plates 532, 534 have local surface deformations 538, 540 which are matched to each other in a manner to be explained in more detail further below.

For each plate 532, 534, the correction device 530 has a drive 544, 546 (merely indicated schematically). The drives 544, 546 make it possible to rotate the plane-parallel plates 532, 534 about the optical axis 26, as indicated by arrows 548, 550. The azimuthal angle of rotation about the optical axis 26 is denoted by θ.

Figure 8:
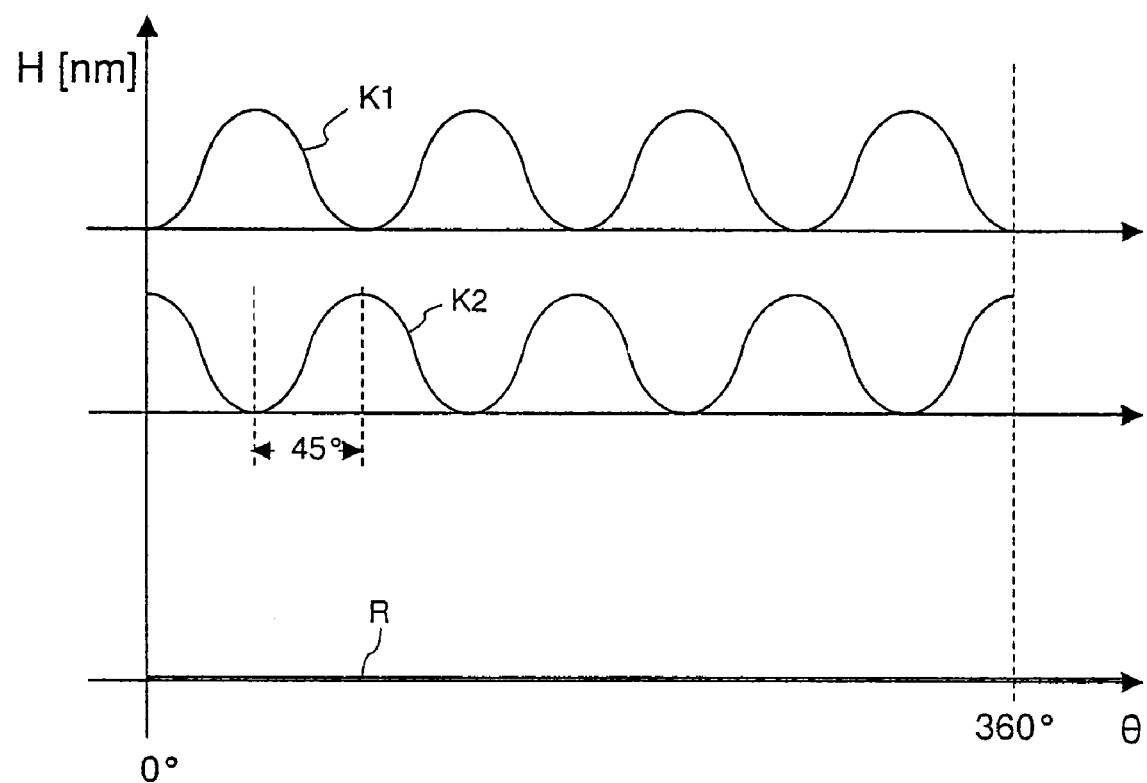
FIG. 8 shows a graph to explain the effected compensation of the correction device shown in FIG. 7, in a first correction state.

FIG. 8 shows a simplified representation of the azimuthal profiles K1 and K2 of the surface deformations 538 and 540, respectively. Here, the height H of the surface deformations 538, 540, measured at a particular radial distance from the optical axis 26, is respectively plotted against the azimuth angle θ. For the sake of simplicity, it is assumed that the azimuthal profiles of the surface deformations 538, 540 are approximately sinusoidal.

With the relative positioning of the two plane-parallel plates 532, 534 as represented in FIG. 7, the surface deformations 538, 540 are arranged mutually offset so that the phase-changing effects of the surface deformations 538, 540 cancel each other out. The overall effect of the correction device 530, which is denoted by R in FIG. 8, is therefore equal to zero in this correction state. Although a wavefront passing through the two plane-parallel plates 532, 534 experiences a retardation in this relative position, it is nevertheless independent of the azimuth angle.

Figure 9:
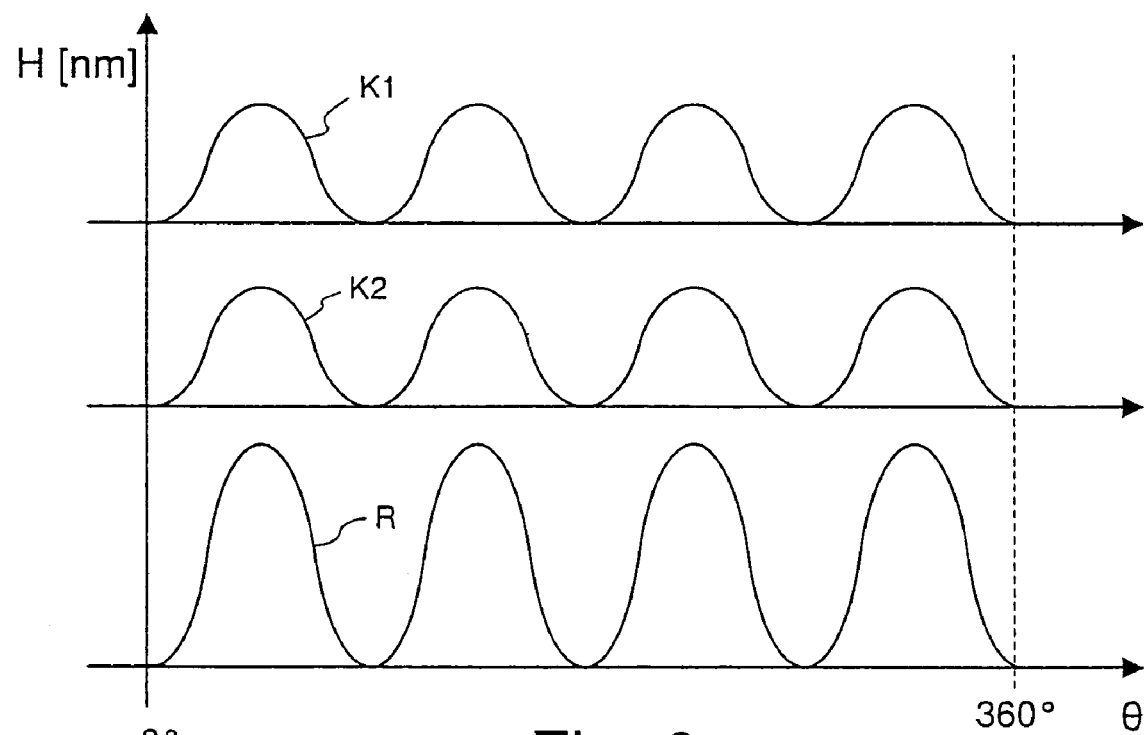
FIG. 9 shows a graph corresponding to FIG. 8, but for a second correction state.

If the two plane-parallel plates 532, 534 are then mutually rotated through 45°±m·90°, then the contributions generated by the surface deformations 538, 540 are superposed in the manner shown in FIG. 9. In this relative position, the correction device 530 has a non-axisymmetric correction effect. Since the two plane-parallel plates 532, 534 are provided with drives 544, 546, the effect achievable by countersense adjustment of the plates 532, 534 is that the overall effect R as shown at the bottom in FIG. 9 is modified merely in terms of its amplitude, but not with respect to the azimuthal position. The correction effect can therefore be adapted virtually continuously to a correction requirement which increases with age.

The use of plane-parallel plates 532, 534 has the advantage that they do not need to be centered along the optical axis. Any tilting can be compensated for by X-Y manipulators which are known per se.

It is furthermore possible to combine the second aspect of the invention, as explained above with reference to FIGS. 7 to 9, with the first aspect of the invention which was explained further above with reference to the exemplary embodiments represented in FIGS. 1 to 8. This offers a further degree of freedom by which the effects due to the local surface deformations 538, 540 can be tailored in a more versatile way. This can be done in a particularly advantageous way when the refractive index of the adjacent fluid can be adjusted by continuously mixing fluids of different refractive indices, as described above with reference to FIG. 4.

The invention claimed is:

1. A projection objective of a microlithographic projection exposure apparatus, comprising:
   a) a first optical element,
   b) a second optical element having a surface facing the first optical element, wherein said surface has a rotationally asymmetric surface deformation for improving at least one imaging property of the projection objective,
   c) a wall which seals an intermediate space formed between the first optical element and the second optical element, and d) an opening in the intermediate space for filling the intermediate space with a fluid.

2. The projection objective of claim 1, wherein the first optical element is arranged immediately adjacent to the second optical element.

3. The projection objective of claim 1, wherein the surface deformation is configured such that it at least partially corrects an imaging error caused by an ageing phenomena.

4. The projection objective of claim 3, wherein the ageing phenomena occurs after a plurality of projections have been carried out.

5. The projection objective of claim 1, comprising an optical element that has a local compensating surface deformation, wherein the compensating surface deformation causes an effect that compensates almost completely for an effect caused by the surface deformation on the second optical element if there is a fluid having a predetermined refractive index in the intermediate space.

6. The projection objective of claim 5, wherein the compensating surface deformation is arranged on a surface of the first and second optical element that is not adjacent to the intermediate space.

7. The projection objective of claim 1, wherein the second optical element has, on a surface facing the first optical element, a coating having a refractive index which is at least substantially identical to a refractive index of the fluid, and wherein the surface deformation is produced directly in the coating.

8. The projection objective of claim 7, wherein the manipulator system comprises a mixing device for mixing fluids with different refractive indices in a predeterminable mixing ratio.

9. The projection objective of claim 8, wherein the mixing device is configured to produce mixtures having a mixing ratio between 0:1 and 1:0.

10. The projection objective of claim 8, wherein one of the fluids is liquid $H_2O$ and the other fluid is liquid $D_2O$.

11. The projection objective of claim 1, comprising a manipulator system for controlled modification of the refractive index of the fluid contained in the intermediate space.

12. The projection objective of claim 11, wherein the manipulator system comprises a feed device for delivering fluids having different refractive indices.

13. The projection objective of claim 12, wherein the manipulator system comprises
a) at least two containers for storing the fluids and
b) a pump for moving the fluids between the intermediate space and the containers.

14. The projection objective of claim 11, wherein the manipulator system has a closed circuit in which the fluid circulates.

15. The projection objective of claim 14, wherein the manipulator system has a first measuring device, which measures the refractive index of the fluid flowing into the intermediate space, and a second measuring device which measures the refractive index of the fluid flowing out of the intermediate space.

16. The projection objective of claim 15, wherein the first and second measuring devices are refractometers.

17. The projection objective of claim 14, wherein the manipulator system has a filter for purifying the circulated fluid.

18. The projection objective of claim 1, wherein first optical element and the second optical element have opposing surfaces that are substantially flat and extend parallel to each other.

19. The projection objective of claim 1, wherein the surface of the second optical element facing the first optical element is arranged in or in close proximity of a pupil plane of the projection objective.

20. A method for the microlithographic production of a microstructured component, comprising the following steps:
a) employing a projection objective of claim 1;
b) arranging a reticle containing structures to be projected in an object plane of the projection objective;
c) projecting the structures onto a photosensitive layer which is arranged in an image plane of the projection objective.

21. A microstructured component which is produced by the method of claim 20.

22. A projection objective of a microlithographic projection exposure apparatus, comprising:
a) an optical element that has a rotationally asymmetric surface deformation causing a wavefront deformation effect that improves at least one imaging property of the projection objective, and
b) a manipulator for selectively switching on and off the wavefront deformation effect.

23. The projection objective of claim 22, wherein the manipulator switches the wavefront deformation effect by bringing a fluid into contact with the surface deformation.

24. The projection objective of claim 22, wherein the manipulator switches the wavefront deformation effect by modifying the spatial relation between the optical element and a compensating optical element.

* * * * *

UNITED STATES PATENT AND TRADEMARK OFFICE
CERTIFICATE OF CORRECTION

PATENT NO. : 7,277,231 B2 Page 1 of 1
APPLICATION NO. : 11/097398
DATED : October 2, 2007
INVENTOR(S) : Schuster et al.

It is certified that error appears in the above-identified patent and that said Letters Patent is hereby corrected as shown below:

Column 11, Lines 54-56; After "formation." delete "By adding heavy water, for example, it is possible to reduce the refractive index 20 that the correction is increased."
Column 12, Line 28; Delete "45°±m·90°" and insert -- 45°±m 90° --, therefor.

Signed and Sealed this

Fifth Day of February, 2008

JON W. DUDAS
*Director of the United States Patent and Trademark Office*